US009420209B2

(12) United States Patent
Ahn et al.

(10) Patent No.: US 9,420,209 B2
(45) Date of Patent: Aug. 16, 2016

(54) METHOD OF GENERATING PIXEL ARRAY LAYOUT FOR IMAGE SENSOR AND LAYOUT GENERATING SYSTEM USING THE METHOD

(71) Applicant: Samsung Electronics Co., Ltd., Suwon-Si, Gyeonggi-Do (KR)

(72) Inventors: Jung Chak Ahn, Yongin-si (KR); Hee Geun Jeong, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 78 days.

(21) Appl. No.: 14/286,040

(22) Filed: May 23, 2014

(65) Prior Publication Data

US 2014/0362272 A1 Dec. 11, 2014

(30) Foreign Application Priority Data

Jun. 5, 2013 (KR) .................. 10-2013-0064781

(51) Int. Cl.
*G06F 17/50* (2006.01)
*H04N 5/3745* (2011.01)
*H01L 27/146* (2006.01)

(52) U.S. Cl.
CPC .......... *H04N 5/3745* (2013.01); *H01L 27/1463* (2013.01); *H01L 27/1464* (2013.01); *H01L 27/14603* (2013.01); *H01L 27/14609* (2013.01); *H01L 27/14614* (2013.01); *H01L 27/14638* (2013.01)

(58) Field of Classification Search
USPC .......................................................... 716/55
See application file for complete search history.

(56) References Cited

U.S. PATENT DOCUMENTS

| | | | |
|---|---|---|---|
| 7,518,172 B2 | 4/2009 | Moon et al. | |
| 2003/0085415 A1 | 5/2003 | Chen et al. | |
| 2004/0092054 A1 | 5/2004 | Mouli et al. | |
| 2004/0094784 A1 | 5/2004 | Rhodes et al. | |
| 2005/0133825 A1 | 6/2005 | Rhodes et al. | |
| 2005/0184291 A1 | 8/2005 | Cole et al. | |
| 2006/0186504 A1* | 8/2006 | Bae .................. | H04N 5/3651 257/462 |
| 2006/0220069 A1 | 10/2006 | Cole et al. | |
| 2007/0045763 A1 | 3/2007 | Yang | |
| 2007/0194213 A1 | 8/2007 | Augusto | |
| 2008/0121952 A1 | 5/2008 | Chu | |
| 2008/0233695 A1 | 9/2008 | Ekbote et al. | |
| 2009/0084847 A1* | 4/2009 | He .................. | G06K 7/10722 235/455 |
| 2009/0115017 A1 | 5/2009 | Chang | |
| 2009/0173976 A1 | 7/2009 | Augusto | |

(Continued)

FOREIGN PATENT DOCUMENTS

| | | | |
|---|---|---|---|
| KR | 100670606 B1 | 1/2007 | |
| KR | 100730469 B1 | 6/2007 | |

(Continued)

*Primary Examiner* — Bryce Aisaka
(74) *Attorney, Agent, or Firm* — Harness, Dickey & Pierce, P.L.C.

(57) ABSTRACT

A method of generating a pixel array layout for an image sensor (wherein the image sensor includes a plurality of unit pixels, and each of the plurality of unit pixels includes a plurality of transistors) includes forming each unit pixel to include a shallow trench isolation (STI). The STI is between a deep trench isolation (DTI) area and one of a p-well region and source and drain regions of each transistor. The p-well region is below a gate of each of the transistors, and the DTI area is filled with at least two materials.

9 Claims, 15 Drawing Sheets

(56) References Cited

U.S. PATENT DOCUMENTS

| | | |
|---|---|---|
| 2009/0303371 A1 | 12/2009 | Watanabe et al. |
| 2010/0090304 A1 | 4/2010 | Liu et al. |
| 2011/0079832 A1 | 4/2011 | Masagaki et al. |
| 2011/0180689 A1* | 7/2011 | Roy .................. H01L 27/14603 250/208.1 |
| 2011/0242388 A1* | 10/2011 | Watanabe ......... H01L 27/14609 348/308 |

FOREIGN PATENT DOCUMENTS

| | | |
|---|---|---|
| KR | 20100050331 A | 5/2010 |
| KR | 101083638 B1 | 11/2011 |

* cited by examiner

METHOD OF GENERATING PIXEL ARRAY LAYOUT FOR IMAGE SENSOR AND LAYOUT GENERATING SYSTEM USING THE METHOD

CROSS-REFERENCE TO RELATED APPLICATIONS

This application claims priority under 35 U.S.C. §119(a) from Korean Patent Application No. 10-2013-0064781 filed on Jun. 5, 2013, the disclosure of which is hereby incorporated by reference in its entirety.

BACKGROUND

At least one example embodiments of the inventive concepts relates to a method of generating a pixel array layout for an image sensor and/or a layout generating system using the method, and more particularly, to a method of generating a different pixel array layout according to the manufacturing purposes of an image sensor and/or a layout generating system using the method.

An image sensor is a device that captures a two-dimensional image or a three-dimensional image of an object. The image sensor generates the image of the object using a photoelectric conversion element that responds to the intensity of light reflected from the object. With the recent development of complementary metal-oxide semiconductor (CMOS) technology, CMOS image sensors using CMOS are widely used.

Noise may occur in output signals of the image sensor for different reasons. Since the noise is directly related to the performance of the image sensor, reducing the noise is desired. In addition, demand for an image sensor has increased with the wide spread use of smart phones, digital cameras, and the like. Demand for elaborate, high-quality images is also increasing. Moreover, as image sensors are used in more fields, it is required to manufacture an image sensor having different characteristics according to the manufacturing purposes of the image sensor.

SUMMARY

According to at least one example embodiment, a method of generating a pixel array layout for an image sensor (wherein the image sensor includes a plurality of unit pixels, each of the plurality of unit pixels including a plurality of transistors) includes forming each unit pixel to include a shallow trench isolation (STI). The STI is between a deep trench isolation (DTI) area and one of a p-well region and source and drain regions of each transistor. The p-well region is below a gate of each of the transistors, and the DTI area is filled with at least two materials.

According to at least one example embodiment, the unit pixel further comprises a floating diffusion formed in contact with the STI.

According to at least one example embodiment, the STI is formed between the floating diffusion and the plurality of transistors.

According to at least one example embodiment, the plurality of unit pixels are arranged in a matrix form.

According to at least one example embodiment, a gate of a transfer transistor among the plurality of transistors is formed using a trench process.

According to at least one example embodiment, the unit pixel further comprises a first ground formed close to a gate of a transfer transistor among the plurality of transistors in each unit pixel.

According to at least one example embodiment, an image sensor includes a pixel array generated using the above described method.

According to at least one example embodiment, a layout generating system includes a layout file storage medium configured to store a plurality of layouts for a pixel array of an image sensor. The layout generating system includes a layout generator configured to select a layout from among the plurality of layouts and generate a final layout by one of reading the selected layout from the layout file storage medium and generating a new layout based on the selected layout. The plurality of layouts includes a layout of a first unit pixel that includes a plurality of first transistors and a shallow trench isolation (STI). The STI is formed between a first p-well region and a first deep trench isolation (DTI) area, and the first p-well region is below a gate of a first drive transistor from among the plurality of first transistors.

According to at least one example embodiment, the first unit pixel further comprises a floating diffusion region in contact with the STI.

According to at least one example embodiment, the STI is formed between the floating diffusion and the plurality of first transistors.

According to at least one example embodiment, the layout of the first unit pixel comprises a plurality of first unit pixels arranged in a matrix form.

According to at least one example embodiment, the STI is formed between a second p-well region and the first DTI area, the second p-well region being below a gate of a select transistor from among the plurality of first transistors.

According to at least one example embodiment, the first unit pixel further comprises a ground formed adjacent to a gate of a transfer transistor from among the plurality of first transistors.

According to at least one example embodiment, the first DTI area is filled with at least two materials.

According to at least one example embodiment, the plurality of layouts includes a layout of a second unit pixel. The second unit pixel includes a plurality of second transistors and a second DTI area. The second DTI area is formed adjacent to a p-well region, and the p-well region is below a gate of a second drive transistor from among the plurality of second transistors.

According to at least one example embodiment, each of the first DTI area and the second DTI area are filled with at least two materials.

According to at least one example embodiment, the layout generator is configured to generate one of the layout of the first unit pixel and the layout of the second unit pixel as the final layout based on desired performance characteristics of the image sensor.

According to at least one example embodiment, the layout generator is configured to generate the layout of the first unit pixel as the final layout if a desired signal-to-noise ratio (SNR) of the image sensor is greater than or equal to a threshold SNR. The layout generator is configured to generate the layout of the second unit pixel as the final layout if the desired SNR of the image sensor is less than the threshold SNR.

According to at least one example embodiment, a device includes a memory configured to store a plurality of layouts for a pixel array of an image sensor, the plurality of layouts including at least a first layout of a first unit pixel and a second layout of a second unit pixel. The first unit pixel includes a first isolation region formed between a second isolation region and a well region associated with a gate of a transistor of the first unit pixel. The first and second isolation regions are formed to different depths within the first unit pixel. The second unit pixel includes a third isolation region formed adjacent to a well region associated with a gate of a second transistor of the second unit pixel. The layout generator is configured to generate one of the first layout and the second layout based on desired performance characteristics of the image sensor.

According to at least one example embodiment, the first isolation region is a shallow trench isolation (STI) region and the second and third isolation regions are deep trench isolation (DTI) regions.

According to at least one example embodiment, the DTI regions are filled with at least two materials.

According to at least one example embodiment, the layout generator is configured to generate the first layout if a desired signal-to-noise ratio (SNR) of the image sensor is greater than or equal to a threshold SNR, and the layout generator is configured to generate the second layout if the desired SNR of the image sensor is less than the threshold SNR.

According to at least one example embodiment, an image sensor includes a unit pixel. The unit pixel includes a shallow trench isolation (STI) region between a deep trench isolation (DTI) region and a well region associated with a gate of a transistor of the unit pixel.

According to at least one example embodiment, the DTI region is filled with at least two materials.

According to at least one example embodiment, the unit pixel includes a floating diffusion region, and the STI region is between the floating diffusion region the DTI region.

According to at least one example embodiment, the DTI region is configured to isolate the unit pixel from surrounding unit pixels of the image sensor.

BRIEF DESCRIPTION OF THE DRAWINGS

The above and other features and advantages of the inventive concepts will become more apparent by describing in detail exemplary embodiments thereof with reference to the attached drawings in which.

DETAILED DESCRIPTION OF EXAMPLE EMBODIMENTS

Figure 1:
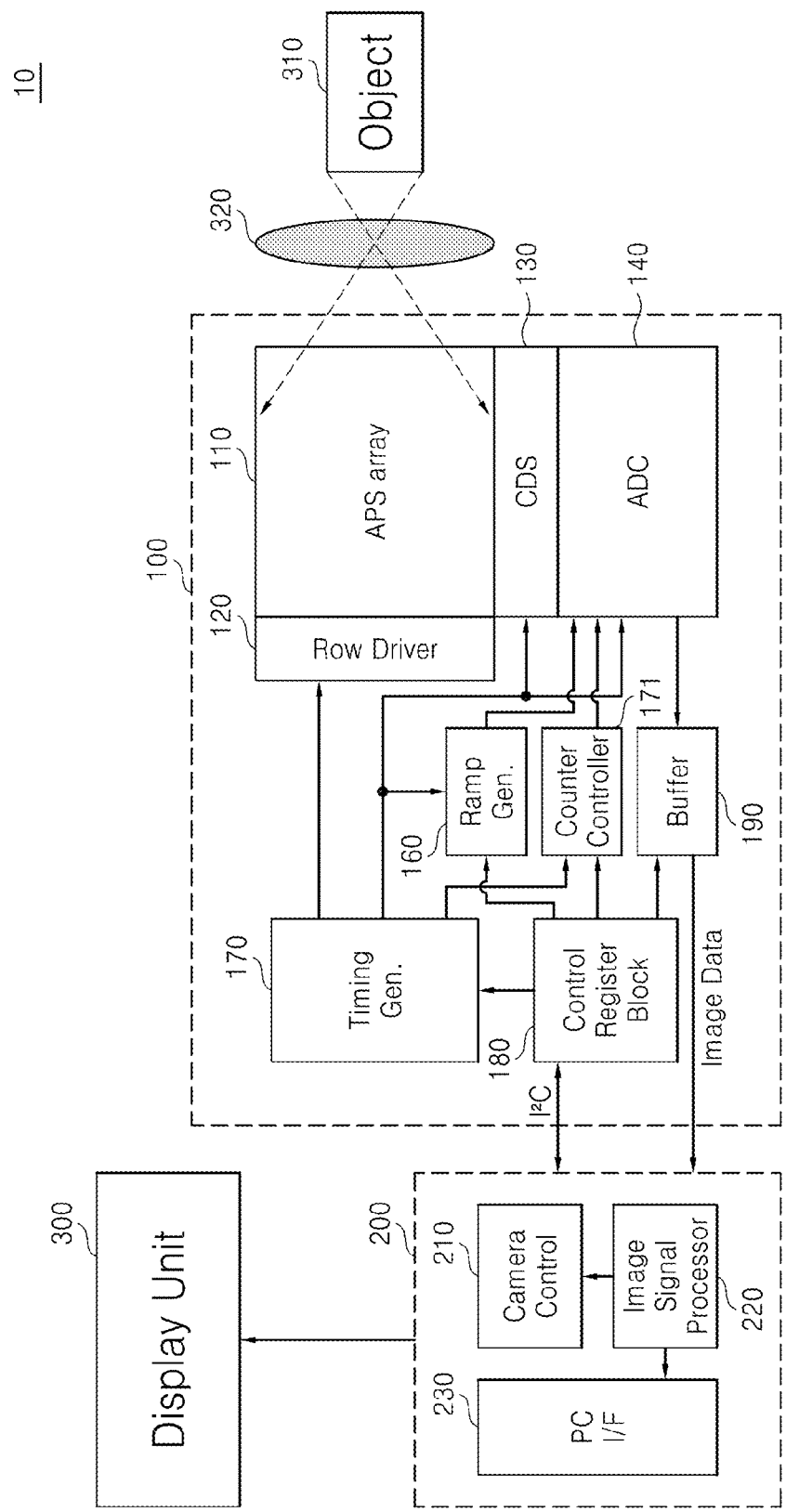
FIG. 1 is a block diagram of an image processing system including a unit pixel according to at least one example embodiment of the inventive concepts.

The inventive concepts now will be described more fully hereinafter with reference to the accompanying drawings, in which example embodiments are shown. The inventive concepts may, however, be embodied in many different forms and should not be construed as limited to the example embodiments set forth herein. Rather, these example embodiments are provided so that this disclosure will be thorough and complete, and will fully convey the scope of the inventive concepts to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of an image processing system 10 including a unit pixel according to at least one example embodiment of the inventive concepts. The image processing system 10 may include an image sensor 100, a digital image processor (DSP) 200, a display unit 300, and a lens 320. The image sensor 100 includes a pixel array (or an active pixel sensor (APS) array) 110, a row driver 120, a correlated double sampling (CDS) block 130, an analog-to-digital converter (ADC) 140, a ramp generator 160, a timing generator 170, a counter controller 171, a control register block 180, and a buffer 190.

The image sensor 100 senses and outputs an image of an object 310 picked up through the lens 320 according to the control of the DSP 200. The DSP 200 outputs the image from the image sensor 100 to the display unit 300. The display unit 300 may be any device that can output an image. For instance, the display unit 300 may be implemented as a computer, a mobile phone, an electronic device equipped with a camera, etc.

The DSP 200 includes a camera control 210, an image signal processor 220, and a personal computer (PC) interface (I/F) 230. The camera control 210 controls the control register block 180. The camera control 210 may control the image sensor 100, and more specifically, the control register block 180 using an inter-integrated circuit (I2C), but the scope of the inventive concepts is not restricted thereto.

The image signal processor 220 receives image data, i.e., an output signal of the buffer 190, processes the image data into an image, and outputs the image to the display unit 300 through the PC I/F 230. The image signal processor 220 is positioned within the DSP 200 in FIG. 1, however, example embodiments are not limited thereto and the design may be changed by those skilled in the art. For instance, the image signal processor 220 may be positioned within the image sensor 100.

The pixel array 110 includes a plurality of photo sensitive devices such as photo diodes or pinned photo diodes. The pixel array 110 senses light using the photo sensitive devices and converts the light into an electrical signal to generate an image signal.

The timing generator 170 may output a control signal or a clock signal to the row driver 120, the ADC 130, the ramp generator 160, and the counter controller 171 to control the operations or the timing of the row driver 120, the ADC 130, the ramp generator 160, and the counter controller 171. The control register block 180 may output a control signal to the ramp generator 160, the timing generator 170, the counter controller 171, and the buffer 190 to control the operations of the elements 160, 170, 171, and 190. The control register block 180 is controlled by the camera control 210.

The counter controller 171 may receive a control signal from the control register block 180 and transmit a counter control signal (CCS) to a plurality of counters (not shown) included in the ADC 130 to control the operations of the counters.

The row driver 120 operates the pixel array 110 in units of rows. The row driver 120 may generate a transfer control signal for controlling a transfer transistor of each of unit pixels included in the pixel array 110, a reset control signal for controlling a reset transistor of each unit pixel, and a select control signal for controlling a select transistor of the unit pixel. The pixel array 110 outputs a reset signal and an image signal, which are output from a row selected by a row selection signal from the row driver 120, to the CDS block 130. The CDS block 130 may perform CDS on the reset signal and the image signal and output a CDS signal.

The ADC 140 compares a ramp signal Vramp received from the ramp generator 160 with the CDS signal from the CDS block 130 and outputs a result signal. The ADC 140 also counts the result signal and outputs a count value to the buffer 190.

The buffer 190 temporarily stores a digital signal output from the ADC 140 and senses and amplifies the digital signal before outputting the digital signal. The buffer 190 may include a column memory block (e.g., static random access memory (SRAM)) including a plurality of memories provided for respective columns to temporarily store the digital signal and a sense amplifier that senses and amplifies the digital signal output from the ADC 140.

Figure 2:
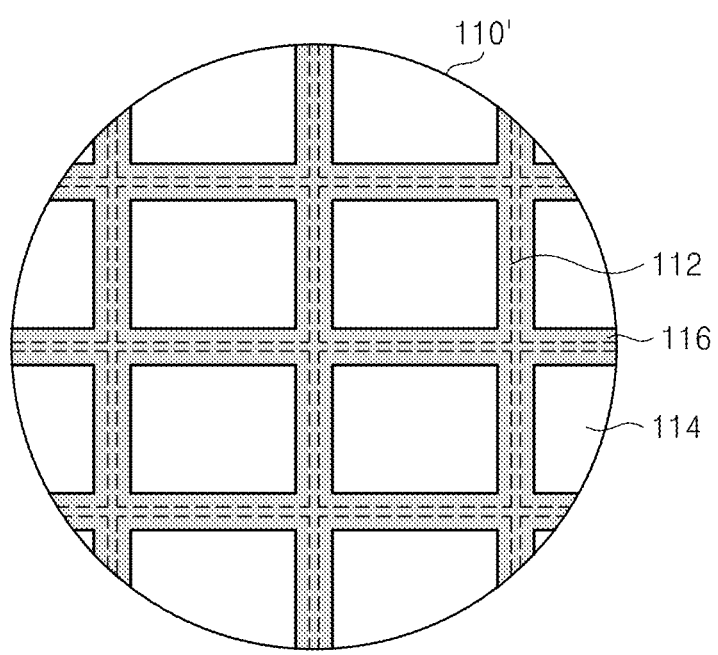
FIG. 2 is a block diagram of a part of a pixel array included in an image sensor illustrated in FIG. 1.

FIG. 2 is a block diagram of a part 110' of the pixel array 110 included in the image sensor 100 illustrated in FIG. 1. Referring to FIGS. 1 and 2, the pixel array 110' may have a structure in which a plurality of unit pixels 112 are arranged in an m×n matrix form (where "m" and "n" are natural numbers of at least 2). Each of the unit pixels 112 may include an active area 114 and a deep trench isolation (DTI) area 116.

The active area 114 may include a plurality of transistors, a photoelectric conversion element, a ground, and a floating diffusion, which will be described later. The active area 114 generates photocharge that varies with the intensity of light reflected from the object 310 and outputs a pixel signal corresponding to the photocharge to the CDS block 130 in units of rows in response to a control signal received from the row driver 120.

The DTI area 116 may be formed at the edge of the active area 114 to electrically and/or optically isolate adjacent active areas 114 from each other. The DTI area 116 formed using a DTI process may be filled with oxide, poly silicon, or the like. The DTI area 116 may reduce (or alternatively, prevent) electric crosstalk in which carrier exchange between the active areas 114 occurs, causing a signal-to-noise ratio (SNR) to decrease. The sidewall of the DTI area 116 may be doped with a material with a high reflectance to reduce (or alternatively, prevent) optical crosstalk in which light incident on a current active area 114 penetrates into an adjacent active area 114, causing the SNR to decrease. For instance, the sidewall of the DTI area 116 may be formed of poly silicon doped with boron with a high reflectance, but the inventive concepts are not restricted to thereto.

Figure 3A:
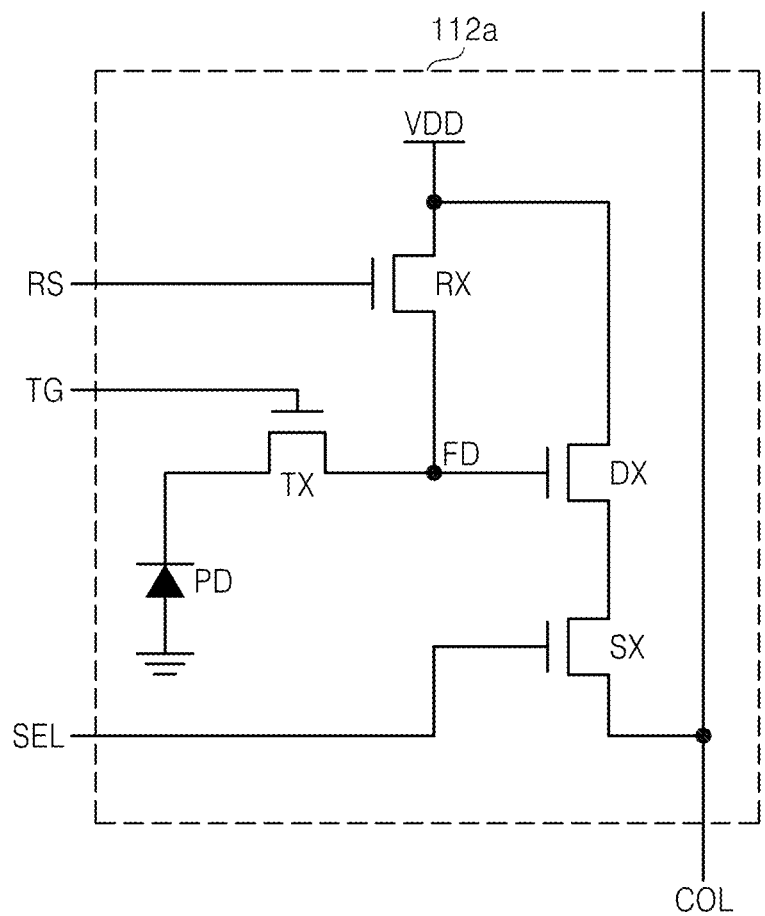
FIGS. 3A through 3E are circuit diagrams of examples of the unit pixel included in a pixel array of the image sensor illustrated in FIG. 1.

FIGS. 3A through 3E are circuit diagrams of examples 112a through 112e of the unit pixel 112 included in the pixel array 110 of the image sensor 100 illustrated in FIG. 1. Referring to FIG. 3A, the unit pixel 112a includes a photodiode PD, a transfer transistor TX, a floating diffusion node FD, a reset transistor RX, a drive transistor DX, and a select transistor SX. The photodiode PD is an example of a photoelectric conversion element and may include at least one of a photo transistor, a photo gate, a pinned photodiode (PPD), and a combination thereof.

FIG. 3A shows a 4-transistor (4T) structure that includes a single photodiode PD and four metal-oxide semiconductor (MOS) transistors TX, RX, DX, and SX, but example embodiments are not restricted to this example. Any circuits including at least three transistors including the drive transistor DX and the select transistor SX and the photodiode PD may be used.

In operation of the unit pixel 112a, the photodiode PD generates photocharge varying with the intensity of light reflected from the object 310. The transfer transistor TX may transfer the photocharge to the floating diffusion node FD in response to a transfer control signal TG received from the row driver 120. The drive transistor DX may transmit the photocharge to the select transistor SX based on potential of the photocharge accumulated at the floating diffusion node FD. A drain terminal of the select transistor SX is connected to a source terminal of the drive transistor DX. The select transistor SX may output a pixel signal to a column line COL connected to the unit pixel 112a in response to a select signal SEL received from the row driver 120. The reset transistor RX may reset the floating diffusion node FD to VDD in response to a reset control signal RS received from the row driver 120.

Figure 3B:
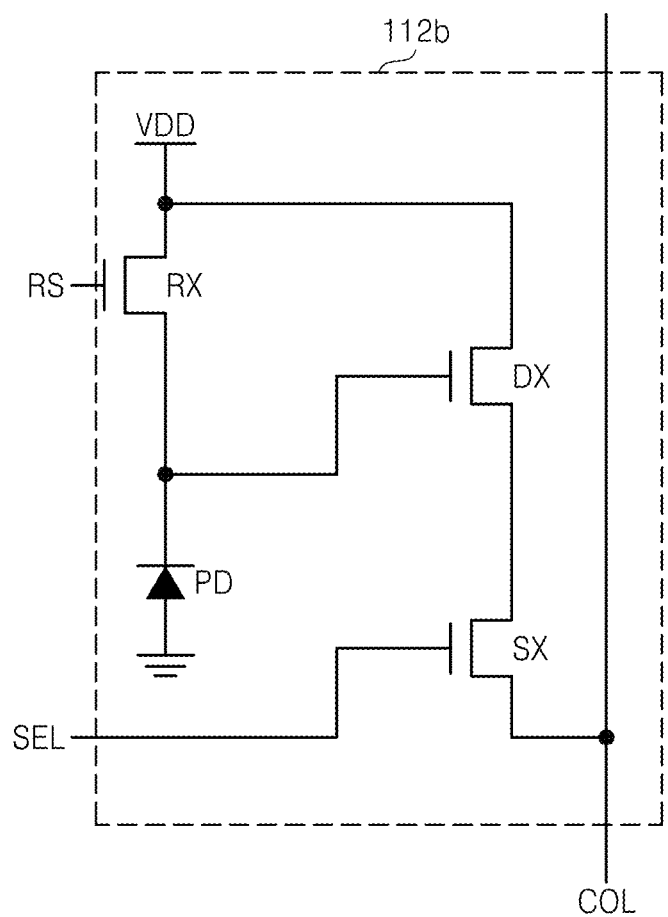

Referring to FIG. 3B, the unit pixel 112b has a 3-transistor (3T) structure that includes the photodiode PD, the reset transistor RX, the drive transistor DX, and the select transistor SX. Photocharge generated by the photodiode PD may be directly accumulated at the floating diffusion node FD. A pixel signal may be output to the column line COL according to the operation of the drive transistor DX and the select transistor SX.

Figure 3C:
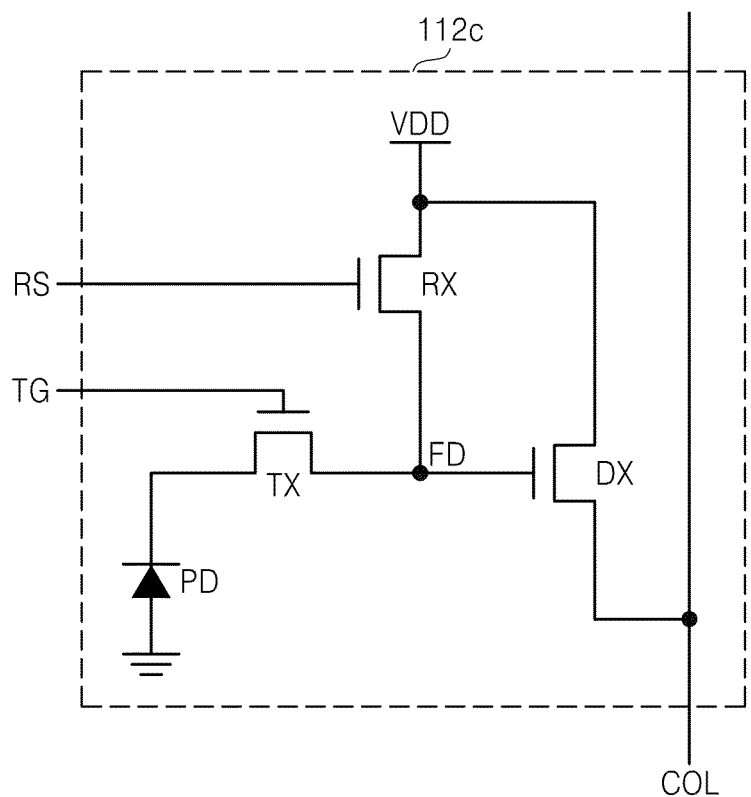

Referring to FIG. 3C, the unit pixel 112c has a 3T structure that includes the photodiode PD, the transfer transistor TX, the reset transistor RX, and the drive transistor DX. The reset transistor RX may be implemented as an n-channel depression type transistor. The reset transistor RX may perform a similar function to the select transistor SX by resetting the floating diffusion node FD to the VDD or setting the floating diffusion node FD to a low level (e.g., 0 V) in response to the reset control signal RS received from the row driver 120.

Figure 3D:
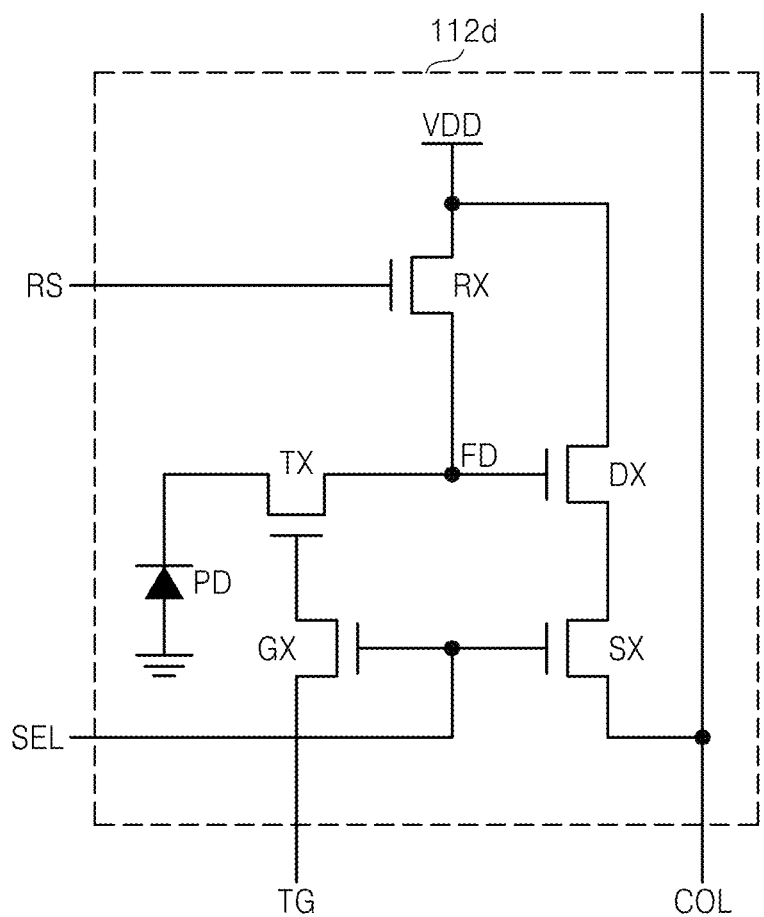

Referring to FIG. 3D, the unit pixel 112D has a 5-transistor (5T) structure that includes the photodiode PD, the transfer transistor TX, the reset transistor RX, the drive transistor DX, the select transistor SX, and another transistor GX.

Figure 3E:
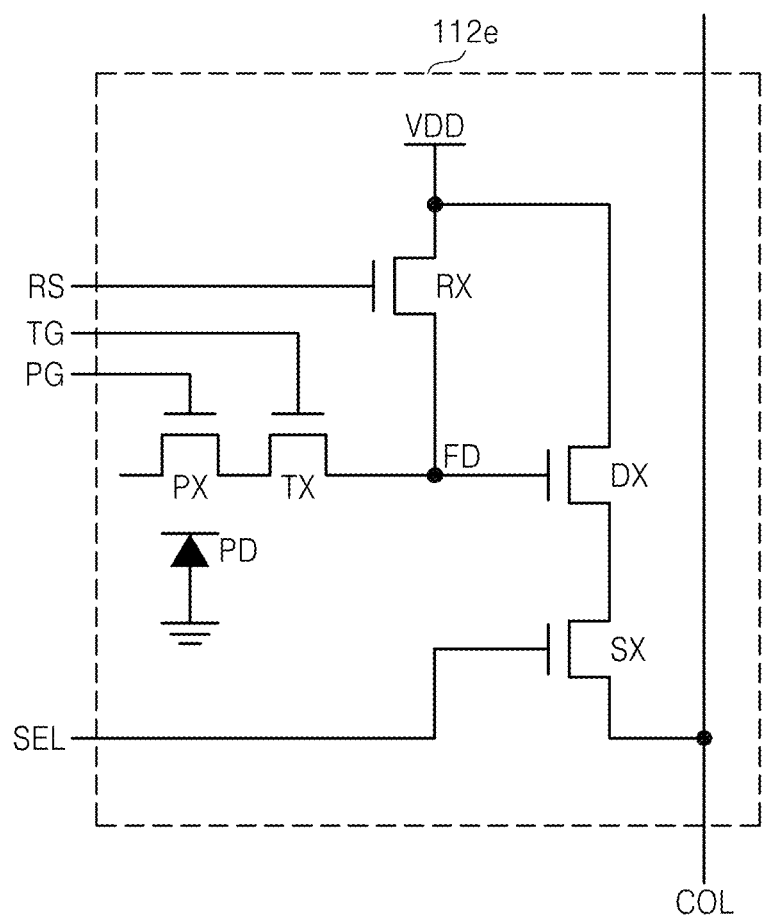

Referring to FIG. 3E, the unit pixel 112e has a 5T structure that includes the photodiode PD, the transfer transistor TX, the reset transistor RX, the drive transistor DX, the select transistor SX, and another transistor PX.

Figure 4A:
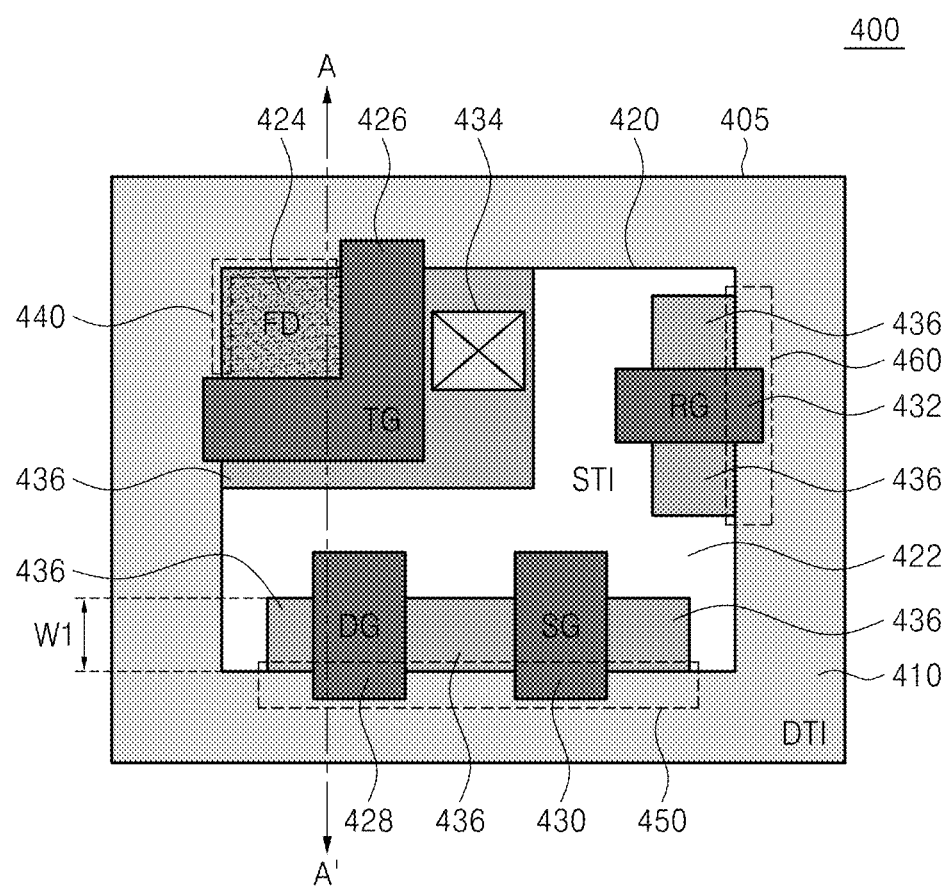
FIG. 4A is a diagram of a first unit pixel layout according to at least one example embodiment of the inventive concepts.
Figure 4B:
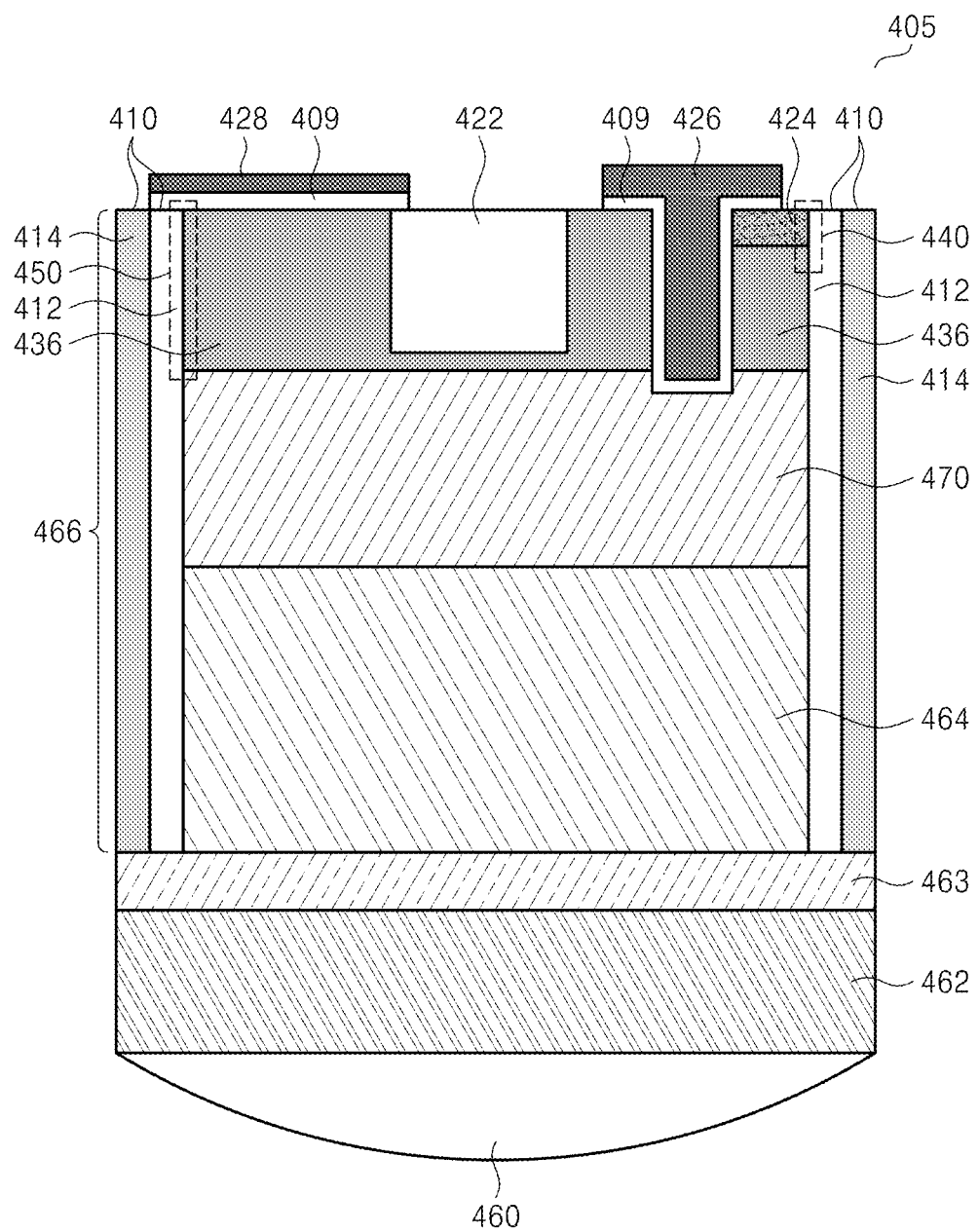
FIG. 4B is a diagram of a vertical cross-section of a first unit pixel illustrated in FIG. 4A.

FIG. 4A is a diagram of a first unit pixel layout 400 according to at least one example embodiment of the inventive concepts. FIG. 4B is a diagram of a vertical cross-section of a first unit pixel 405 illustrated in FIG. 4A.

Referring to FIG. 4A, the first unit pixel layout 400 shows the disposition of elements included in the first unit pixel 405. A plurality of first unit pixels 405 arranged in an m×n matrix (where "m" and "n" are natural numbers of at least 2) may form the pixel array 110 illustrated in FIG. 1.

The first unit pixel layout 400 may include a DTI area 410 and an active area 420. The DTI area 410 may be formed to prevent electric crosstalk and optical crosstalk between adjacent active areas 420, as described above with reference to FIG. 2.

The active area 420 may include a shallow trench isolation (STI) 422, a floating diffusion 424, a transfer transistor gate 426, a drive transistor gate 428, a select transistor gate 430, a reset transistor gate 432, a ground 434, and a p-well region 436. Although FIG. 4A shows the layout of a unit pixel having the 4T structure illustrated in FIG. 3A, the inventive concepts are not restricted to the 4T structure and may also be applied to unit pixels having other structures such as a 3T structure and a 5T structure. In addition, the disposition of the elements included in the active area 420 is not restricted to the embodiment illustrated in FIG. 4A and may be changed freely.

The STI 422 may be formed around the floating diffusion 424, the transfer transistor gate 426, the drive transistor gate 428, the select transistor gate 430, the reset transistor gate 432, the ground 434, and the p-well region 436 inside the DTI area 410. The STI 422 may be formed using an STI process to electrically isolate the elements from one another. The STI 422 may be shallower than the DTI area 410.

The floating diffusion 424 may be formed close to the transfer transistor gate 426. The floating diffusion 424 corresponds to the floating diffusion node FD illustrated in FIGS. 3A through 3E and is a node at which photocharges generated by the photodiode PD are transmitted to through the transfer transistor TX and accumulated. The respective gates 426, 428, 430, and 432 of the transfer transistor TX, the drive transistor DX, the select transistor SX, and the reset transistor RX may receive a control signal or may be connected to the floating diffusion node FD, as described above with reference to FIGS. 3A through 3E.

The ground 434 may apply a ground voltage necessary for the operation of the first unit pixel 405. For instance, the ground 434 may apply the ground voltage to an end of the photodiode PD.

The p-well region 436 may be formed around the ground 434, the drive transistor gate 428, the select transistor gate 430, and the reset transistor gate 432. A region (not shown) doped with n++ impurities may be formed in the p-well region 436. The n++-doped region may function as a source or drain terminal of the drive transistor DX, the select transistor SX, and the reset transistor RX. The p-well region 436 may electrically isolate the n++-doped region.

FIG. 4B is a cross-sectional view of the first unit pixel 405 taken along the vertical line A-A'. The first unit pixel 405 may be formed by staking a micro lens 460, a color filter 462, an anti-reflection layer 463, and a semiconductor substrate 466. The semiconductor substrate 466 may include the DTI area 410, an epitaxial layer 464, a photodiode 470, the p-well region 436, the STI 422, the drive transistor gate 428, the transfer transistor gate 426, and the floating diffusion 424. In FIG. 4B, it is assumed that light reflected from an object 310 is incident from the bottom and the transistors included in the first unit pixel 405 are n-channel MOS (NMOS) transistors. In at least one other example embodiment, the transistors may be p-channel MOS (PMOS) transistors.

The micro lens 460 may be placed at the bottom of the first unit pixel 405 to increase light gathering power, thereby increasing the quality of images. The color filter 462 may be placed on the micro lens 460 to selectively transmit light with a desired (or alternatively, predetermined) wavelength (e.g., red, green, blue, magenta, yellow, or cyan). A planarization layer (not shown), also called an over-coating layer, may be formed below the color filter 462. The color filter 462 may be omitted when the first unit pixel 405 forms a depth sensor.

The anti-reflection layer 463 may be formed on the color filter 462 to reduce (or alternatively, prevent) light incident through the micro lens 460 and the color filter 462 from being reflected. In other words, the anti-reflection layer 463 efficiently transmits incident light, thereby increasing the performance (e.g., light guiding efficiency and photo sensitivity) of an image sensor.

The DTI area 410 may reduce (or alternatively, prevent) electric crosstalk and/or optical crosstalk between adjacent pixels, as described above with reference to FIG. 2. The DTI area 410 may include oxide 412 and/or poly silicon 414 for electric/optical isolation from an adjacent pixel (not shown). The epitaxial layer 464 may be a p-type epitaxial layer formed on a p-type bulk silicon substrate.

The photodiode 470 may be formed as an n-type region by performing ion implantation on the epitaxial layer 464. The photodiode 470 may be formed of a plurality of doped regions in a stack structure. In this case, an upper doped region may be formed by implanting n+-type ions and a lower doped region may be formed by implanting n-type ions. The photodiode 470 may be formed in the entire area of the first unit pixel 405 except for the DTI area 410 in order to obtain a high fill factor. The fill factor may be defined as a ratio of a light receiving area to the entire area of a unit pixel. The higher the fill factor, the higher the light guiding efficiency.

The p-well region 436 may be formed on the photodiode 470 to electrically isolate the photodiode 470 from the transistors. The n++-doped region close to the gates 428, 430, and 432 may function as the source or drain terminal of each transistor. Multi-layer conductive lines (not shown) may be formed on the semiconductor substrate 466. The multi-layer conductive lines may be formed by patterning conductive materials including metals such as copper and aluminum.

The STI 422 may be formed to electrically isolate adjacent elements of the first unit pixel 405. The drive transistor gate 428 and the transfer transistor gate 426 may be formed on corresponding parts, respectively, of a gate isolation layer 409. The gate isolation layer 409 may be formed of SiO2, SiON, SiN, Al2O3, Si3N4, GexOyNz, GexSiyOz, or other high dielectric material. The high dielectric material may be formed by performing atomic layer deposition of HfO2, ZrO2, Al2O3, Ta2O5, hafnium silicate, zirconium silicate, or a combination thereof.

The transfer transistor gate 426 may be formed using a trench process when the photodiode 470 is formed at the center of the semiconductor substrate 466. The transfer transistor gate 426 may be formed to be above or below the top surface of the photodiode 470. The floating diffusion 424 may be formed close to the transfer transistor gate 426. The floating diffusion 424 may be electrically isolated from the photodiode 470 by the p-well region 436.

Referring to FIGS. 4A and 4B, first through third borders 440, 450, and 460 are illustrated. The first border 440 is between the DTI area 410 and the floating diffusion 424. The DTI area 410 and the floating diffusion 424 may be formed to contact each other at the first border 440.

The second border 450 is between the p-well region 436 formed around the drive transistor gate 428 and the select transistor gate 430 and the DTI area 410. The p-well region 436 formed around the drive transistor gate 428, the select transistor gate 430 and the DTI area 410 may be formed to contact each other at the second border 450.

The third border 460 is between the p-well region 436 formed around the reset transistor gate 432 and the DTI area 410. The p-well region 436 formed around the reset transistor gate 432 and the DTI area 410 may be formed to contact each other at the third border 460.

The DTI area 410 may be formed using a trench process. The trench process may include forming a trench to a proper depth in the semiconductor substrate 466. The trench process may be divided into a DTI process of forming a relatively deep trench and an STI process of forming a relatively shallow trench. A surface formed using the DTI process may be rougher than a surface formed using the STI process.

Since the floating diffusion 424 directly contacts the DTI area 410 at the first border 440, the vertical plane of the floating diffusion 424 may be rough. The floating diffusion 424 is fundamental in an operation in which photocharges generated by a photoelectric conversion element are accumulated and then sensed by the drive transistor DX to be generated as an image signal. When the vertical plane of the floating diffusion 424 is rough at the first border 440, this may influence the voltage level of the floating diffusion 424. This influence may cause noise in a pixel signal output from the select transistor SX and the noise may lead the deterioration of the image quality in the image sensor 100.

In addition, the p-well region 436 formed around the drive transistor gate 428, the select transistor gate 430, and the reset transistor gate 432 directly contacts the DTI area 410 at the second and third borders 450 and 460. Therefore, the vertical plane of the p-well region 436 may be rough. The p-well region 436 may include the n++-doped region functioning as the source or drain terminal of each transistor. When a voltage higher than a threshold voltage is applied to the gates 428, 430, and 432, charge shift occurs between the source terminal and the drain terminal through the p-well region 436. At this time, when the vertical plane of the p-well region 436 is rough at the second and third borders 450 and 460, an interface leakage current increases due to etch damage, causing noise in the pixel signal. In other words, when charge moves between the source and drain terminals of each transistor, flicker noise (or 1/f noise) may occur due to a trap on the rough plane. As a result, the image quality of the image sensor 100 may deteriorate due to the flicker noise. In particular, flicker noise in the p-well region 436 between the source and drain terminals of the drive transistor DX may affect the image quality.

Figure 5A:
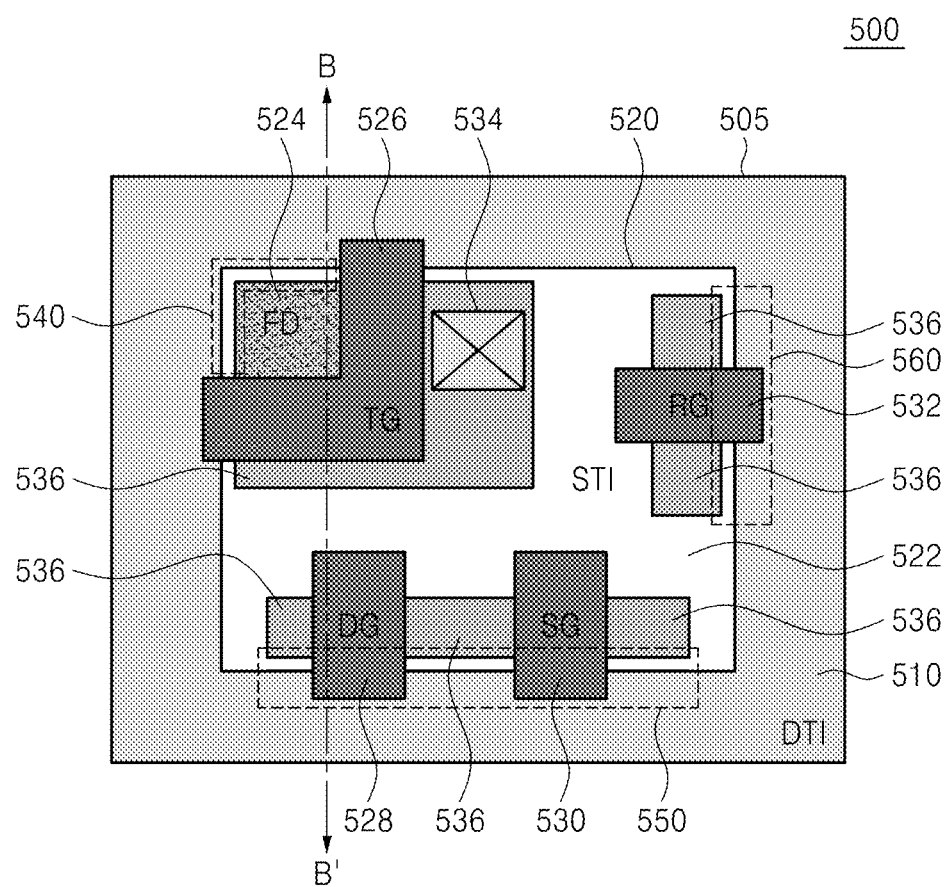
FIG. 5A is a diagram of a second unit pixel layout according to at least one example embodiment of the inventive concepts.

When the first unit pixel layout 400 illustrated in FIG. 4A is formed, noise may occur at the first through third borders 440, 450, and 460, but the pixel size may be much smaller than when a second unit pixel layout 500 illustrated in FIG. 5A is formed. In addition, processes are simpler since, for example, an STI is not present at the first through third borders 440, 450, and 460. Moreover, a width W1 of the p-well region 436 formed between the source and drain terminals of each transistor may be maintained to be at least a desired (or alternatively, predetermined) value. Accordingly, when it is not desired to minimize the influence of noise according to the manufacturing purposes of the image sensor 100, a layout generation module 630, which will be described with reference to FIG. 6, may generate the first unit pixel layout 400 illustrated in FIG. 4A.

When the first through third borders 440, 450, and 460 are formed, the p-well region 436 and the floating diffusion 424 may be formed first and then the DTI area 410 may be formed using a DTI process. Thereafter, the DTI area 410 may be filled with the oxide 412 and/or the poly silicon 414. In addition, the drive transistor gate 428 and the gate isolation layer 409 corresponding to the gate 428 may be sequentially formed.

Figure 5B:
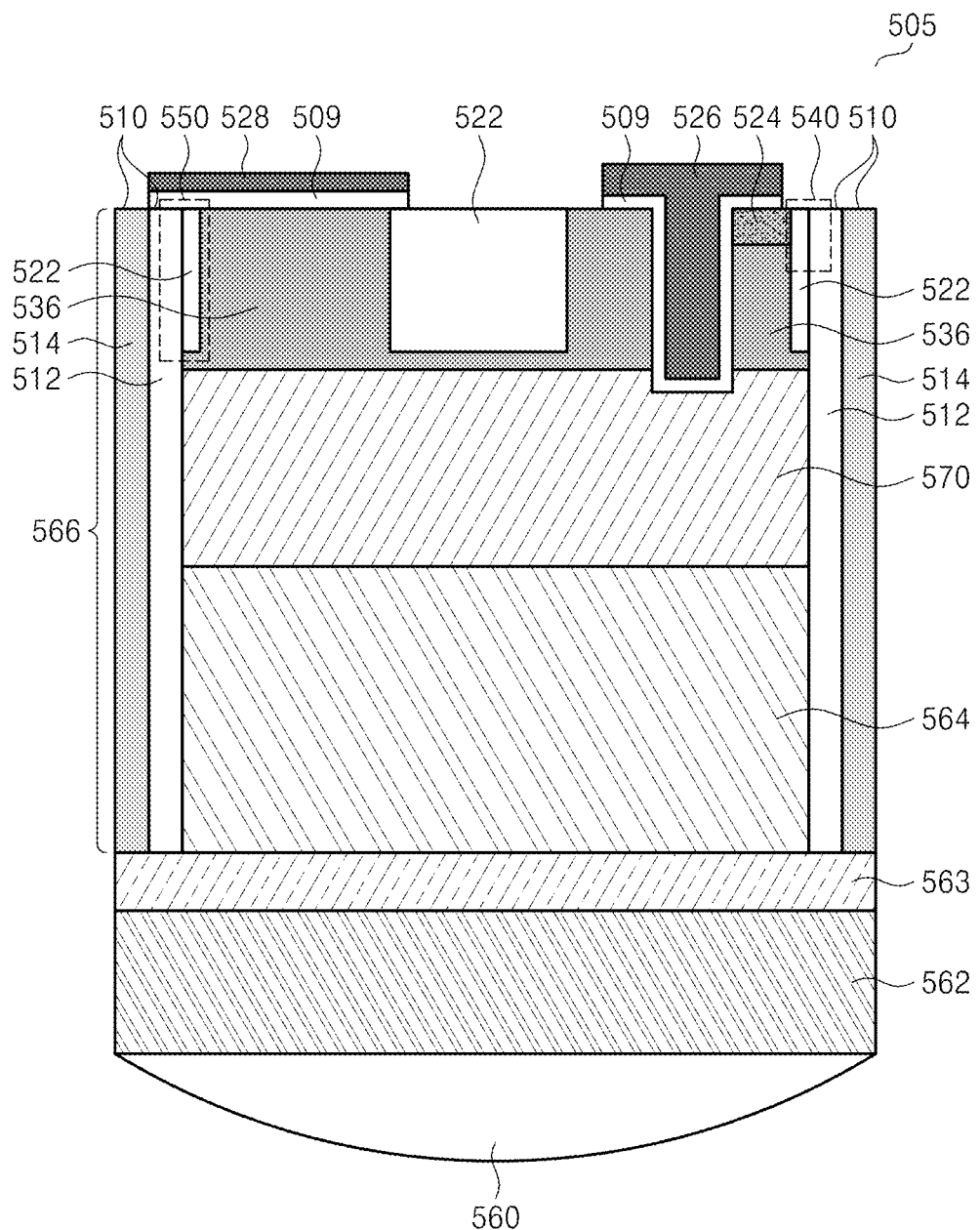
FIG. 5B is a diagram of a vertical cross-section of a second unit pixel illustrated in FIG. 5A.

FIG. 5A is a diagram of the second unit pixel layout 500 according to at least one example embodiment of the inventive concepts. FIG. 5B is a diagram of a vertical cross-section of a second unit pixel 505 illustrated in FIG. 5A. The second unit pixel layout 500 illustrated in FIG. 5A and the vertical cross-section of the second unit pixel 505, illustrated in FIG. 5B, taken the vertical line B-B' are similar to the first unit pixel layout 400 illustrated in FIG. 4A and the vertical cross-section of the first unit pixel 405 illustrated in FIG. 4B. Thus, the differences will be mainly described. In other words, elements 500 through 570 illustrated in FIGS. 5A and 5B are substantially the same as the elements 400 through 470 illustrated in FIGS. 4A and 4B.

In the second unit pixel layout 500, the first border 540 is between the DTI area 510 and the floating diffusion 524. Unlike in the first unit pixel 405 illustrated in FIG. 4A, the DTI area 510 and the floating diffusion 524 are not in direct contact at the first border 540 and may have an STI 522 therebetween.

The second border 550 is between the p-well region 536 formed around the drive transistor gate 528 and the select transistor gate 530 and the DTI area 510. Unlike in the first unit pixel 405 illustrated in FIG. 4A, the p-well region 536 formed around the drive transistor gate 528 and the select transistor gate 530 and the DTI area 510 are not in direct contact at the second border 550 and may have the STI 522 therebetween.

The third border 560 is between the p-well region 536 formed around the reset transistor gate 532 and the DTI area 510. Unlike in the first unit pixel 405 illustrated in FIG. 4A, the p-well region 536 formed around the reset transistor gate 532 and the DTI area 510 are not in direct contact at the third border 560 and may have the STI 522 therebetween.

As described above with reference to FIGS. 4A and 4B, a surface formed using a DTI process is rougher than a surface formed using an STI process, causing more noise. For this reason, the second unit pixel layout 500 may have the STI 522, whose vertical plane less rough than the vertical plane of the DTI area 510, between the floating diffusion 524 and the DTI area 510 at the first border 540, differently from the first unit pixel layout 400 of the first unit pixel 405 illustrated in FIGS. 4A and 4B.

In this case, since the STI 522 is formed at the first border 540, the change in a voltage level may be reduced compared to the floating diffusion 424 of the first unit pixel 405. As a result, noise is reduced and the image quality of the image sensor 100 is increased. In addition, the STI 522 is formed between the DTI area 510 and the p-well region 536 formed around the drive transistor gate 528, the select transistor gate 530, and the reset transistor gate 532 at the second and third borders 550 and 560.

Charge may move between n++-doped regions (not shown) functioning as the source and drain terminals of each transistor in the p-well region 536. The vertical plane of the p-well region 536 at the second and third borders 550 and 560 is less rough than that illustrated in FIGS. 4A and 4B, so that an interface leakage current occurring due to etch damage is reduced. As a result, noise in a pixel signal is reduced. In other words, the trap phenomenon is reduced during the charge shift between the source and drain terminals of each transistor, so that flicker noise is reduced. As a result, the image quality of the image sensor 100 is increased.

When the second unit pixel layout 500 illustrated in FIG. 5A is formed, noise at the first through third borders 440, 450, and 460 may be reduced, but the pixel size may increase as compare to the first unit pixel layout 400 illustrated in FIG. 4A. In addition, processes may be more complicated since, for example, an STI is present at the first through third borders 540, 550, and 560. Accordingly, when it is desired to minimize the influence of noise according to the manufacturing purposes of the image sensor 100, the layout generation module 630 illustrated in FIG. 6 may generate the second unit pixel layout 500 illustrated in FIG. 5A.

When the first through third borders 540, 550, and 560 are formed, the p-well region 536 and the floating diffusion 524 may be formed first and then the STI 522 may be formed using an STI process. The STI 522 may be filled with oxide. Thereafter, the DTI area 510 may be formed using a DTI process. The DTI area 510 may be filled with the oxide 512 and/or the poly silicon 514. In addition, the drive transistor gate 528 and the gate isolation layer 509 corresponding to the gate 528 may be sequentially formed.

Figure 6:
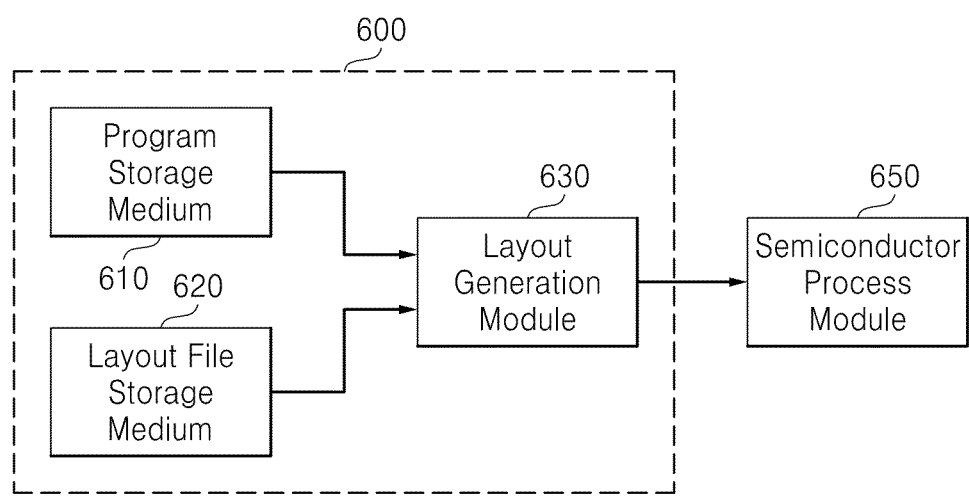
FIG. 6 is a block diagram of a layout generating system according to at least one example embodiment of the inventive concepts.

FIG. 6 is a block diagram of a layout generating system 600 according to at least one example embodiment of the inventive concepts. Referring to FIGS. 4A through 6, the layout generating system 600 may include a program storage medium (or memory) 610, a layout file storage medium 620, and the layout generation module 630.

The program storage medium 610 may store a series of commands for generating a layout. The layout file storage medium 620 may store a plurality of layouts for the pixel array 110 of the image sensor 100. The layout file storage medium 620 may be implemented as a searchable database.

The program storage medium 610 and the layout file storage medium 620 may be implemented as a compact disk (CD) or non-volatile memory that retains information regardless of the supply of power. The non-volatile memory may be flash memory, phase-change random access memory (PRAM), resistive RAM (RRAM), etc.

The layout generation module 630 may include a processor (not shown) that executes at least one program. The layout generation module 630 may read a command from the program storage medium 610 and execute the command. The layout generation module 630 may generate a layout for the pixel array 110 of the image sensor 100, taking into account the manufacturing purposes and/or desired performance characteristics of the image sensor 100. In detail, when generating a layout, the layout generation module 630 may select the first unit pixel layout 400 or the second unit pixel layout 500, taking into account the manufacturing purposes and/or performance characteristics of the image sensor 100, such as whether to minimize noise, whether to increase the width of a p-well between the source and drain terminals of each transistor, whether to minimize a pixel size, and/or whether to simplify the processes. For example, the layout generator may generate the layout 500 if a desired signal-to-noise ratio (SNR) of the image sensor 100 is greater than or equal to a threshold SNR. Further, the layout generator may generate the layout 400 pixel if the desired SNR of the image sensor is less than the threshold SNR. The threshold SNR may be selected by, for example, a user of the layout generating system 600 based on an intended application of the image sensor 100.

The layout generation module 630 may determine the size of a unit pixel, a gap between unit pixels, the number of transistors included in each unit pixel, and/or positions of elements taking into account a maximum effective distance between the elements based on the selected layout. The layout generation module 630 may search the layout file storage medium 620 to determine whether a layout satisfying the determined conditions and/or desired performance characteristics exists in the layout file storage medium 620. When the satisfying layout exists in the layout file storage medium 620, the layout generation module 630 may read the layout from the layout file storage medium 620. When the satisfying layout does not exist in the layout file storage medium 620, the layout generation module 630 may generate the layout according to the determined conditions and/or desired performance characteristics.

The layout generating system 600 may generate a final layout for the pixel array 110 and transmit the layout to a semiconductor process module 650. The semiconductor process module 650 may manufacture the pixel array 110 by generating a mask according to the layout and performing a trench process, a gap filling process, a cleaning process, a gate generating process, and so on. The layout generating system 600 may be implemented as part of the semiconductor process module 650.

Figure 7:
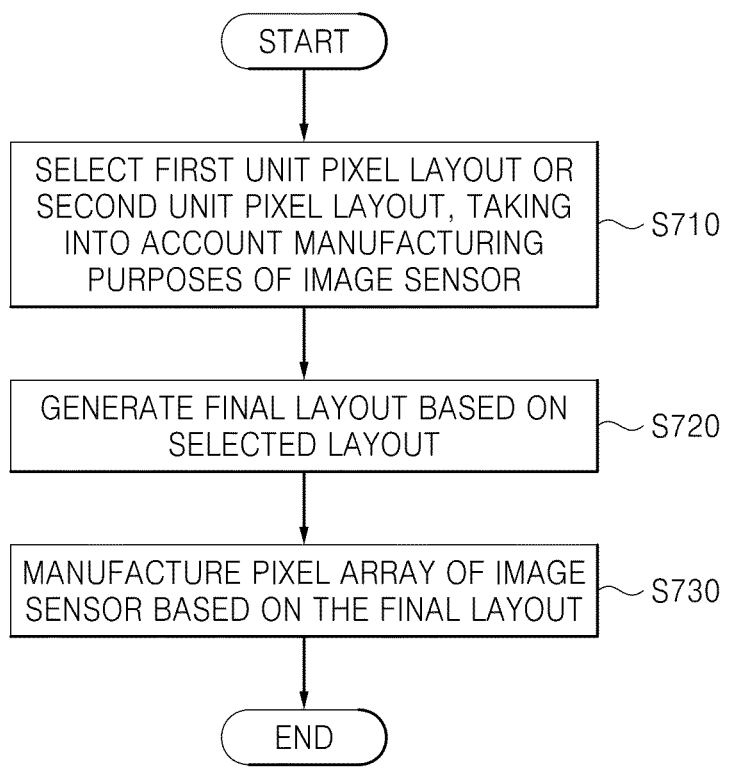
FIG. 7 is a flowchart of a method of generating a layout for a pixel array of an image sensor according to at least one example embodiment of the inventive concepts.

FIG. 7 is a flowchart of a method of generating a layout for the pixel array 110 of the image sensor 100 according to at least one example embodiment of inventive concepts. Referring to FIGS. 4A through 7, the layout generation module 630 may generate a layout for the pixel array 110, taking into account the manufacturing purposes and/or desired performance characteristics of the image sensor 100. In detail, when generating a layout, the layout generation module 630 may select the first unit pixel layout 400 or the second unit pixel layout 500, taking into account the manufacturing purposes and/or desired performance characteristics such as whether to minimize noise, whether to increase the width of a p-well between the source and drain terminals of each transistor, whether to minimize a pixel size, and whether to simplify the processes, in operation S710.

The layout generation module 630 may determine the size of a unit pixel, a gap between unit pixels, the number of transistors included in each unit pixel, and positions of elements taking into account a maximum effective distance between the elements based on the selected layout. The layout generation module 630 may search the layout file storage medium 620 to find out whether a layout satisfying the determined conditions and/or desired performance characteristics exists in the layout file storage medium 620. When the satisfying layout exists in the layout file storage medium 620, the layout generation module 630 may read the layout from the layout file storage medium 620 in operation S720. When the satisfying layout does not exist in the layout file storage medium 620, the layout generation module 630 may generate the layout according to the determined conditions and/or desired performance characteristics in operation S720.

The semiconductor process module 650 may receive the layout from the layout generation module 630 and manufacture the pixel array 110 of the image sensor 100 by generating a mask according to the layout and performing a trench process, a gap filling process, a cleaning process, a gate generating process, and so on in operation S730.

As described above, according to at least one example embodiment of inventive concepts, a layout for a pixel array of an image sensor is selected taking into account the manufacturing purposes and/or desired performance characteristics of the image sensor, so that an image sensor that meets the intended application is manufactured.

Figure 8:
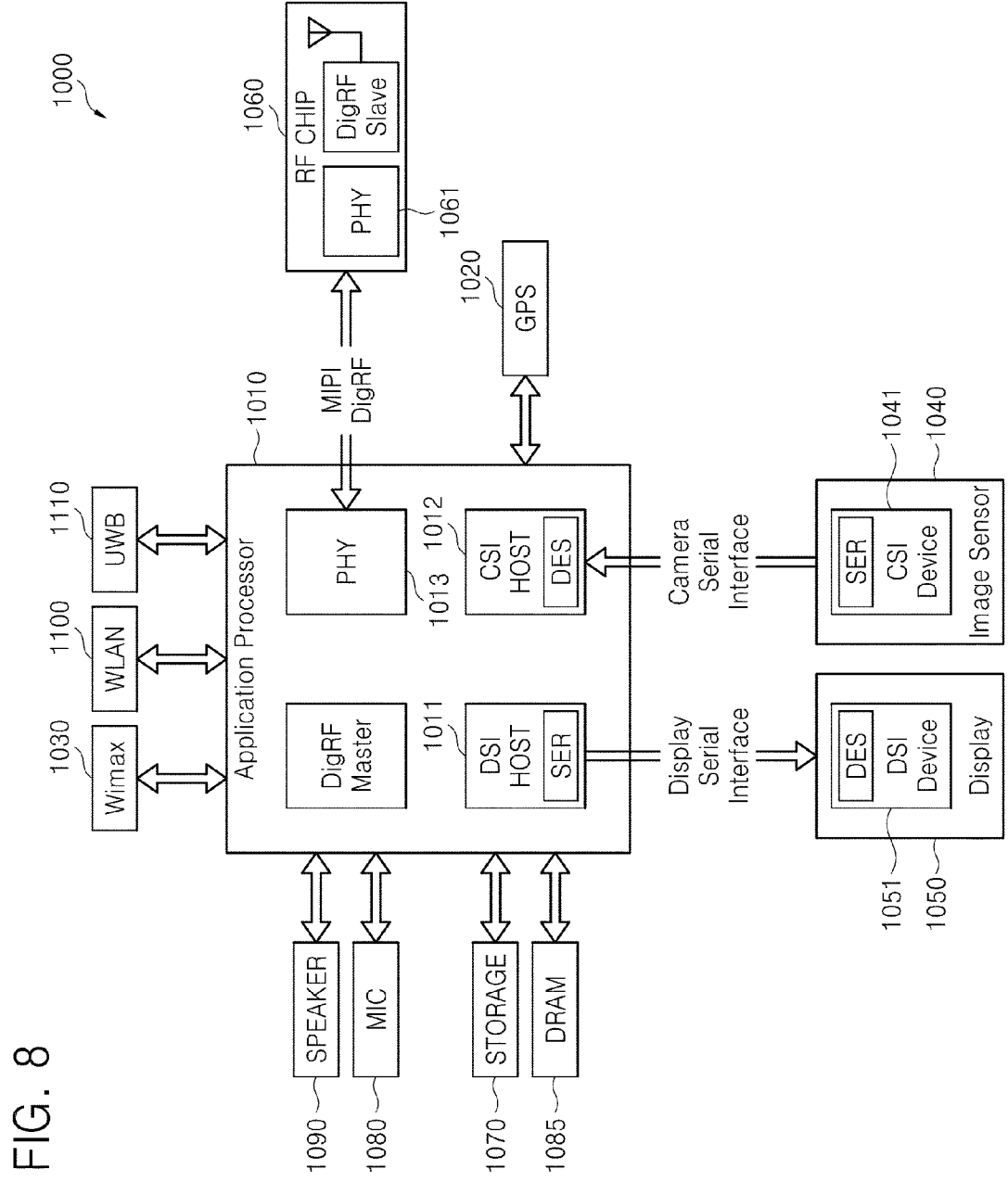
FIG. 8 is a block diagram of an electronic system including an image sensor having a unit pixel according to at least one example embodiment of the inventive concepts.

FIG. 8 is a block diagram of an electronic system including an image sensor having a unit pixel according to at least one example embodiment of the inventive concepts. The electronic system 1000 may be implemented by a data processing apparatus, such as a mobile phone, a personal digital assistant (PDA), a portable media player (PMP), an IP TV, a smart phone that can use or support the MIPI interface, etc. The electronic system 1000 includes an application processor 1010, an image sensor 1040, and a display 1050.

A camera serial interface (CSI) host 1012 included in the application processor 1010 performs serial communication with a CSI device 1041 included in the image sensor 1040 through CSI. For example, an optical de-serializer (DES) may be implemented in the CSI host 1012, and an optical serializer (SER) may be implemented in the CSI device 1041.

A display serial interface (DSI) host 1011 included in the application processor 1010 performs serial communication with a DSI device 1051 included in the display 1050 through DSI. For example, an optical serializer may be implemented in the DSI host 1011, and an optical de-serializer may be implemented in the DSI device 1051.

The electronic system 1000 may also include a radio frequency (RF) chip 1060 which communicates with the application processor 1010. A physical layer (PHY) 1013 of the electronic system 1000 and a PHY of the RF chip 1060 communicate data with each other according to a MIPI DigRF standard. The electronic system 1000 may further include at least one element among a GPS 1020, a storage device 1070, a microphone 1080, a DRAM 1085 and a speaker 1290. The electronic system 1000 may communicate using Wimax (World Interoperability for Microwave Access) 1030, WLAN (Wireless LAN) 1100 or UWB (Ultra Wideband) 1110, etc.

Figure 9:
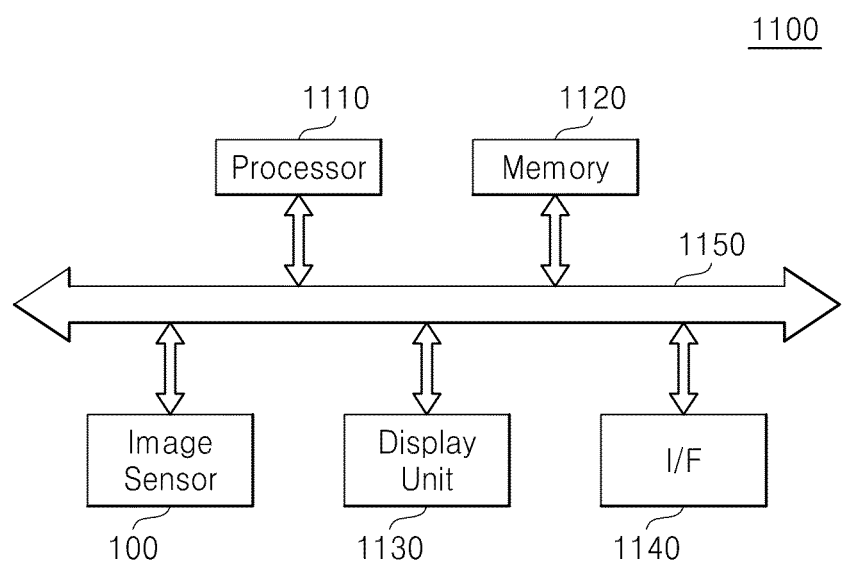
FIG. 9 is a block diagram of a data processing system 1100 an image sensor having a unit pixel according to at least one example embodiment of the inventive concepts.

FIG. 9 is a block diagram of a data processing system 1100 an image sensor having a unit pixel according to at least one example embodiment of the inventive concepts. Referring to FIG. 9, the image processing system 1100 may include a processor 1110, a memory 1120, an image sensor 100, a display unit 1130 and an interface 1140.

The processor 1110 may control operations of the image sensor 100. For example, the processor 1110 may generate two-dimensional (2D) or three-dimensional (3D) image based on at least one of depth information and color information (e.g., red information, green information, blue information, magenta information, cyan information, or yellow information) output from the image sensor 100.

The memory 1120 may store the generated image and program for controlling the operations of the image sensor 100 via a bus 1150 according to control of the processor 1110. The processor 1110 may access information stored in the memory 1120 and execute the program stored in the memory 1120. The memory 1120 may be implemented as non-volatile memory.

The image sensor 100 may generate two-dimensional (2D) or three-dimensional (3D) image information based on each digital pixel signal (e.g., color information or depth information) according to control of the processor 1110.

The display unit may receive the generated image from the processor 1110 or the memory 1120, and display the image via a display (e.g., LCD, AMOLED, etc.).

The interface 1140 may be implemented as an interface for inputting/outputting two-dimensional (2D) or three-dimensional (3D) image. The interface 1140 may be implemented as wireless interface.

The inventive concepts can also be embodied as computer-readable codes on a computer-readable medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices.

The computer-readable recording medium can also be distributed over network coupled computer systems so that the computer-readable code is stored and executed in a distributed fashion. Also, functional programs, codes, and code segments to accomplish the present general inventive concept can be easily construed by programmers.

While the inventive concepts have been particularly shown and described with reference to exemplary embodiments thereof, it will be understood by those of ordinary skill in the art that various changes in forms and details may be made therein without departing from the spirit and scope of the inventive concepts as defined by the following claims.

What is claimed is:
1. A pixel array generating system, comprising:
   a layout file storage medium configured to store a plurality of layouts for a pixel array of an image sensor;
   a layout generator configured to select a layout from among the plurality of layouts and generate a final layout by one of reading the selected layout from the layout file storage medium and generating a new layout based on the selected layout; and
   a semiconductor processing apparatus configured to manufacture the pixel array of the image sensor based on the generated final layout,
   wherein the plurality of layouts includes a layout of a first unit pixel that includes a layout of a plurality of first transistors and a shallow trench isolation (STI), the STI being formed between a first p-well region and a first deep trench isolation (DTI) area, the first p-well region being below a gate of a first drive transistor from among the plurality of first transistors,
   wherein the plurality of layouts includes a layout of a second unit pixel that includes a layout of a plurality of second transistors and a second DTI area, the second DTI area being formed adjacent to a second p-well region, the second p-well region being below a gate of a second drive transistor from among the plurality of second transistors, and
   wherein the layout generator is further configured to generate one of the layout of the first unit pixel and the layout of the second unit pixel as the final layout based on desired performance characteristics of the image sensor.

2. The pixel array generating system of claim 1, wherein the first unit pixel further comprises a floating diffusion region in contact with the STI.

3. The pixel array generating system of claim 2, wherein the STI is formed between the floating diffusion and the plurality of first transistors.

4. The pixel array generating system of claim 1, wherein the layout of the first unit pixel comprises a plurality of first unit pixels arranged in a matrix form.

5. The pixel array generating system of claim 1, wherein the STI is formed between a third p-well region and the first DTI area, the third p-well region being below a gate of a select transistor from among the plurality of first transistors.

6. The pixel array generating system of claim 1, wherein the first unit pixel further comprises a ground formed adjacent to a gate of a transfer transistor from among the plurality of first transistors.

7. The pixel array generating system of claim 1, wherein the first DTI area is filled with at least two materials.

8. The pixel array generating system of claim 1, wherein each of the first DTI area and the second DTI area are filled with at least two materials.

9. The pixel array generating system of claim 1, wherein
the layout generator is further configured to generate the layout of the first unit pixel as the final layout if a desired signal-to-noise ratio (SNR) of the image sensor is greater than or equal to a threshold SNR; and
the layout generator is further configured to generate the layout of the second unit pixel as the final layout if the desired SNR of the image sensor is less than the threshold SNR.

* * * * *